(12) United States Patent
Pyeon

(10) Patent No.: US 7,791,175 B2
(45) Date of Patent: Sep. 7, 2010

(54) METHOD FOR STACKING SERIALLY-CONNECTED INTEGRATED CIRCUITS AND MULTI-CHIP DEVICE MADE FROM SAME

(75) Inventor: Hong Beom Pyeon, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 73 days.

(21) Appl. No.: 12/236,874

(22) Filed: Sep. 24, 2008

(65) Prior Publication Data

US 2009/0020855 A1    Jan. 22, 2009

Related U.S. Application Data

(63) Continuation-in-part of application No. 12/168,354, filed on Jul. 7, 2008.

(60) Provisional application No. 61/015,345, filed on Dec. 20, 2007, provisional application No. 61/032,203, filed on Feb. 28, 2008.

(51) Int. Cl.
*H01L 23/538* (2006.01)
*H01L 23/48* (2006.01)
*H01L 23/485* (2006.01)

(52) U.S. Cl. .............. 257/621; 257/774; 257/777; 257/778; 257/E23.02; 257/E23.011; 257/E23.174

(58) Field of Classification Search .............. 257/621, 257/774, 777, 778, E23.011, E23.02, E23.174
See application file for complete search history.

(56) References Cited

U.S. PATENT DOCUMENTS

| | | | |
|---|---|---|---|
| 5,191,405 | A | 3/1993 | Tomita et al. |
| 5,399,898 | A | 3/1995 | Rostoker |
| 5,477,082 | A | 12/1995 | Buckley, III et al. |
| 5,502,289 | A | 3/1996 | Takiar et al. |
| 5,579,207 | A | 11/1996 | Hayden et al. |
| 6,187,652 | B1 | 2/2001 | Chou et al. |
| 6,388,320 | B2 | 5/2002 | Smola et al. |

(Continued)

FOREIGN PATENT DOCUMENTS

CA    2196024    8/1997

OTHER PUBLICATIONS

PCT Patent Application No. PCT/CA2008/002235, International Search Report dated Apr. 8, 2009; pp. 2-3.

*Primary Examiner*—Victor A Mandala
(74) *Attorney, Agent, or Firm*—Curtis B. Behmann; Borden Ladner Gervais LLP

(57) ABSTRACT

A multi-chip device and method of stacking a plurality substantially identical chips to produce the device are provided. The multi-chip device, or circuit, includes at least one through-chip via providing a parallel connection between signal pads from at least two chips, and at least one through-chip via providing a serial or daisy chain connection between signal pads from at least two chips. Common connection signal pads are arranged symmetrically about a center line of the chip with respect to duplicate common signal pads. Input signal pads are symmetrically disposed about the center line of the chip with respect to corresponding output signal pads. The chips in the stack are alternating flipped versions of the substantially identical chip to provide for this arrangement. At least one serial connection is provided between signal pads of stacked and flipped chips when more than two chips are stacked.

20 Claims, 14 Drawing Sheets

U.S. PATENT DOCUMENTS

| | | |
|---|---|---|
| 6,410,431 B2 | 6/2002 | Bertin et al. |
| 6,555,917 B1 | 4/2003 | Heo |
| 6,566,746 B2 | 5/2003 | Isaak et al. |
| 6,650,008 B2 | 11/2003 | Tsai et al. |
| 6,678,167 B1 | 1/2004 | Degani et al. |
| 6,849,802 B2 | 2/2005 | Song et al. |
| 6,861,761 B2 | 3/2005 | Yang et al. |
| 6,921,968 B2 | 7/2005 | Chung |
| 7,102,905 B2 | 9/2006 | Funaba et al. |
| 7,115,972 B2 * | 10/2006 | Dotta et al. ............. 257/621 |
| 7,125,745 B2 | 10/2006 | Chen et al. |
| 7,132,754 B1 | 11/2006 | Schmidt |
| 7,163,842 B2 | 1/2007 | Karnezos |
| 7,173,340 B2 | 2/2007 | Zhou et al. |
| 7,193,310 B2 | 3/2007 | Roeters et al. |
| 7,217,995 B2 | 5/2007 | Tsai et al. |
| 7,268,418 B2 | 9/2007 | Wang |
| 7,271,026 B2 | 9/2007 | Gross |
| 7,276,799 B2 | 10/2007 | Lee et al. |
| 7,291,924 B2 | 11/2007 | Wang et al. |
| 7,531,905 B2 * | 5/2009 | Ishino et al. ............. 257/777 |
| 2001/0001292 A1 * | 5/2001 | Bertin et al. ............. 438/107 |
| 2002/0180025 A1 | 12/2002 | Miyata et al. |
| 2003/0209809 A1 * | 11/2003 | Lasky et al. ............. 257/778 |
| 2006/0001176 A1 * | 1/2006 | Fukaishi et al. ............. 257/777 |
| 2006/0197211 A1 | 9/2006 | Miyata et al. |
| 2006/0286822 A1 | 12/2006 | Thomas et al. |
| 2007/0246257 A1 | 10/2007 | Muff et al. |
| 2008/0122040 A1 * | 5/2008 | Brogan et al. ............. 257/621 |
| 2009/0283872 A1 * | 11/2009 | Lin et al. ............. 257/621 |

* cited by examiner

METHOD FOR STACKING SERIALLY-CONNECTED INTEGRATED CIRCUITS AND MULTI-CHIP DEVICE MADE FROM SAME

CROSS REFERENCE TO RELATED APPLICATIONS

This application claims the benefit of priority of U.S. Provisional Patent Application No. 61/015,345 filed Dec. 20, 2007, of U.S. Provisional Patent Application No. 61/032,203 filed Feb. 28, 2008, and is a continuation-in-part of U.S. patent application Ser. No. 12/168,354 filed Jul. 7, 2008, each of which is incorporated herein by reference in its entirety.

FIELD OF THE INVENTION

The present invention relates generally to integrated circuits, or chips. More particularly, the present invention relates to the arrangement of chip connections for chip stacking.

This application is related to earlier filed U.S. patent application Ser. No. 11/324,023 entitled "Multiple Independent Serial Link Memory," filed on Dec. 30, 2005, the entire teachings of which are incorporated herein by reference.

This application is related to earlier filed U.S. Continuation-in-Part patent application Ser. No. 11/594,564 entitled "Daisy Chain Cascading Devices," filed on Nov. 8, 2006, the entire teachings of which are incorporated herein by reference.

This application is related to earlier filed U.S. Provisional Patent Application Ser. No. 61/013,036 entitled "Memory System With Point-To-Point Ring Topology," filed on Dec. 12, 2007, the entire teachings of which are incorporated herein by reference.

BACKGROUND OF THE INVENTION

The integration of multiple chips into a single package has been a major trend in the semiconductor industry in order to reduce the volume and cost of consumer products. So far, many multi-chip packaging methods have been introduced and used in real products.

As the density of chips has increased, chip packaging itself has been changed significantly in terms of size and pin counts. According to the high density of memory chip and small form-factor issues, MCPs (Multi Chip Packages) are a good solution to make any system more compact. So far, the majority of chip stacking has been done with wire bonding technology. However, it requires as much space as conventional bonding pads on each chip to be connected by bonding wires.

In order to make MCPs, a more complicated lead-frame is required. Also, each chip should be disposed to have enough spacing, which results in a form factor increase. Bonding wire technology can also reduce the mechanical durability of the MCP from the wires being at odd angles.

In addition, wire bonding requires spacers for each chip. This results in increased height of the stack, which makes the handling and the assembly of the integrated device stack more challenging compared to stacks that do not comprise spacers. Also, the length of the bond wires is greater in a chip stack having spacers, which leads to a reduced electrical performance of the chip stack system. Furthermore, the thermal resistance of an integrated device stack having a spacer in the integrated device chips is increased.

Conventional integrated device stacks are prone to produce electrical shorts of the bond wires while applying the spacer material and while positioning an integrated device onto the spacer material. This reduces reliability and yield of production. Conventional bonding wire based die stacking does not provide compact packaging. Large loading effects also result from the wire length and connection layout.

Another approach is to use a via between chips. The through chip via can be a better approach to resolve the issue of noise from the electrical characteristics.

FIG. 1 shows a partial top view 102 and cross-section view 104 of a conventional multi-chip stack or multi-chip device 100 made using through-chip via technology. In the top view 102, a plurality of signal pads A1-A6 and B1-B6 are shown, which facilitate connection of internal and external signals to the chip. The vias themselves are not seen in the top view. The cross section-view 104 is taken along line A-A in the top view. The through chip via method used in FIG. 1 relates to common input or output connections, or parallel connections. Because of this, the only real fabrication issue was how deeply clean holes could be drilled and made to connect the same pins to each other as a common connection. In the case of multi-drop connections among same memory chips, the alignment of each chip is so important that all chips are aligned without a pad spacer, which is required in the bonding wire connection for multi-chip packaging.

Other known approaches are directed to the use of through chip vias for parallel connections between chips. For example, United States Patent Application Publication No. US 2007/0246257-A1 describes a memory circuit in which memory chips are connected by through silicon vias in a multi drop topology. However, in this approach, the via extends through all memory chips of a stack, thus limiting the type of connectivity that can be provided.

It is, therefore, desirable to provide a multi-chip package, or stack of chips, that use through-chip vias to provide other connections for daisy chain connections to enhance signal performance.

SUMMARY OF THE INVENTION

It is an object of the present invention to obviate or mitigate at least one disadvantage of previous multi-chip devices.

In a first aspect, the present invention provides a multi-chip device including a stacked pair of integrated circuit chips comprising a top chip and a bottom chip. The top chip has one or more input signal pads for connection to external input signals and one or more common connection signal pads. Each common connection signal pad is symmetrically disposed on or about a center line of the top chip with respect to a duplicate common connection signal pad. One or more output signal pads are symmetrically disposed about the center line of the top chip with respect to respective input signal pads. The bottom chip has a substantially identical signal pad arrangement as the top chip, the bottom chip being flipped in orientation with respect to the top chip. The device includes a parallel connection through-chip via connecting a top chip common connection signal pad in parallel with its duplicate common connection signal pad. The device also includes a serial connection through-chip via connecting a top chip output signal pad in series with its respective input signal pad on the bottom chip.

The one or more input signal pads, the one or more common connection signal pads and the one or more output signal pads can be disposed along a single edge of the top chip. The one or more input signal pads can be disposed on the same side of the center line of the top chip. The device can further include a plurality of serial connection through-chip vias connecting top chip output signal pads in series with their respective input signal pads on the bottom chip and/or a plurality of parallel connection through-chip vias connecting top chip common connection signal pads in parallel with their duplicate common connection signal pads on the bottom chip.

In an embodiment, the stacked chips are aligned so there is substantially no offset. For example, an edge of a top chip can line up vertically with a corresponding edge of the bottom chip. In another embodiment, the stacked chips face the same direction as one another. For example, a side of the first chip having selected signal pads can face the same direction as a side of the second chip having the same selected signal pads.

In another aspect, the present invention provides a multi-chip device comprising a plurality of substantially identical chips including a top chip, an even number of intermediate chips and a bottom chip. Each chip includes one or more input signal pads and one or more common connection signal pads. Each common connection signal pad is symmetrically disposed on or about a center line of the chip with respect to a duplicate common connection signal pad. One or more output signal pads are symmetrically disposed about the center line of the chip with respect to respective input signal pads. A parallel connection through-chip via connects corresponding common connection signal pads on each chip together in parallel. A serial connection through-chip via connects an output signal pad on one chip in series with its respective input signal pad on another chip.

In this same aspect, the top chip has the one or more input signal pads for connection to external input signals, the common connection signal pads for connection to external common signals, and the one or more output signal pads connected to respective input signal pads of an adjacent chip. The bottom chip has the one or more output signal pads for connection to external output signals, the common connection signal pads for connection to the external common signals and the one or more input signal pads connected to respective output signal pads of an adjacent chip. At least one of the intermediate chips has the one or more output signal pads connected serially to respective one or more input signal pads of an adjacent intermediate chip. The plurality of substantially identical chips have substantially identical signal pad arrangements and are provided in a stack. Each alternating chip in the stack is flipped in orientation with respect an adjacent chip.

The even number of intermediate chips can be an even multiplicity of intermediate chips having the one or more output signal pads connected to respective one or more input signal pads of a plurality of adjacent intermediate chips. The device can further include an insulator disposed between pads of adjacent intermediate chips to prevent contact between selected adjacent pads. The parallel connection through-chip via can extend through the insulator and through the corresponding common connection signal pads of the intermediate chips. A through-pad via can extend through the insulator to connect the one or more output signal pads of one of the intermediate chips to respective one or more input signal pads of an adjacent intermediate chip.

The device can further include a controller for controlling access to the plurality of substantially identical chips. In that case, controller input connections can be provided to connect output signal pads from the bottom chip to an input side of the controller. Controller output connections can be provided to connect an output side of the controller to the input pads of the top chip. The controller can placed below the stacked chips, in which case the controller output connections can comprise wire bonding, or can be placed above the stacked chips, in which case the controller input connections can comprise wire bonding.

In a further aspect, the present invention provides a method for stacking serially-connected integrated circuits including the following steps: flipping a first chip so that its top side bearing transistors faces in a first direction to become a bottom chip; placing a second chip on top of the flipped first chip, the second chip being substantially identical in pad arrangement and placement to the first chip; creating through pad and chip via holes to facilitate connection of signal pads of the top chip to corresponding signal pads of the bottom chip to create at least one series connection and at least one parallel connection; disposing an insulation layer in the via holes; and disposing a conductor in the via holes to create through-via connections between the pads on the top chip and the bottom chip to create a stacked pair of integrated circuit chips.

The step of creating the through pad and chip via holes can include creating a first through-chip and through-pad via hole to facilitate connection between a top chip common connection signal pad in parallel with its duplicate common connection signal pad. The step of creating the through pad and chip via holes can include creating a second through-chip and through-pad via hole to facilitate connection between a top chip output signal pad in series with its respective input signal pad on the bottom chip.

The method can further include the following steps: depositing an insulation layer on top of the stacked pair of integrated circuit chips; forming contact holes in the insulation layer to permit connection between certain adjacent signal pads when another chip is later placed on top; depositing a conductor into the contact holes; etching a conductor layer to remove excess conductor material from the portions outside the contact holes; and attaching two previously combined chips on top of the stacked pair of integrated circuit chips to create a multi-chip circuit for a multi-chip package, the two previously combined chips being substantially identical to the stacked pair of integrated circuit chips.

The method can still further include the following steps: providing a memory controller for controlling access to the plurality of substantially identical chips; connecting input signal pads of the top chip to an output side of the controller; and connecting output signal pads from the bottom chip to an input side of the controller.

In another aspect, the present invention provides a multi-chip device comprising a plurality of substantially identical chips including a top chip and a bottom chip. The top and bottom chips have substantially identical signal pad arrangements, the bottom chip being flipped in orientation with respect to the top chip. The device includes at least one serial through-chip via to connect at least one output signal pad of the top chip to a respective input signal pad of the bottom chip. At least one parallel through-chip via is provided in the device to connect at least one common connection signal pad on the top chip to at least one duplicate common connection signal pad on the bottom chip.

In a still further aspect, the present invention provides a multi-chip device comprising a plurality of substantially identical chips including a top chip, an even number of intermediate chips and a bottom chip. Each chip in the device has substantially identical signal pad arrangements. The chips are provided in a stack. Each alternating chip in the stack being flipped in orientation with respect an adjacent chip. The device further includes at least one parallel through-chip via, at least one serial through-chip via, and at least one serial connection between output and input signal pads of two of the intermediate chips.

In a yet further aspect, the present invention provides a multi-chip package comprising a plurality of substantially identical chips including a top chip, an even number of intermediate chips and a bottom chip. The chips are provided in a stack. Each chip in the device has substantially identical signal pad arrangements. Each alternating chip in the stack is flipped in orientation with respect an adjacent chip. The device also includes at least one parallel through-chip via, at least one serial through-chip via, and at least one serial connection between output and input signal pads of two of the intermediate chips. The device further includes package input connectors for connection to external input signals, and package output connectors for connection to external output signals.

In a still further aspect, the present invention provides a method of fabricating a multi-chip device having two pairs of stacked chips, including the following steps: flipping a first chip so that its top side bearing transistors faces in a first direction to become a bottom chip; placing a second chip on top of the flipped first chip, the second chip being substantially identical in pad arrangement and placement to the first chip; creating through pad and chip via holes to facilitate connection of signal pads of the top chip to corresponding signal pads of the bottom chip to create at least one series connection and at least one parallel connection; disposing an insulation layer in the via holes; disposing a conductor in the via holes to create through-via connections between the pads on the top chip and the bottom chip to create a stacked pair of integrated circuit chips.

In the same aspect, the method further includes: depositing an insulation layer on top of the stacked pair of integrated circuit chips; forming contact holes in the insulation layer to permit connection between certain adjacent signal pads when another chip is later placed on top; depositing a conductor into the contact holes; etching a conductor layer to remove excess conductor material from the portions outside the contact holes; attaching two previously combined chips on top of the stacked pair of integrated circuit chips to create a multi-chip circuit for a multi-chip package, the two previously combined chips being substantially identical to the stacked pair of integrated circuit chips; adding wire bonding to connect input signal pads of the top chip to an output side of the controller and to connect output signal pads from the bottom chip to an input side of the controller; and covering the entire package or compound.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a multi-chip device and method of stacking a plurality of substantially identical chips to produce the device. The multi-chip device, or circuit, includes at least one through-chip via providing a parallel connection between signal pads from at least two chips, and at least one through-chip via providing a serial or daisy chain connection between signal pads from at least two chips. Common connection signal pads are arranged symmetrically about a center line of the chip with respect to duplicate common signal pads. Input signal pads are symmetrically disposed about the center line of the chip with respect to corresponding output signal pads. The chips in the stack are alternating flipped versions of the substantially identical chip to provide for this arrangement. At least one serial connection is provided between signal pads of stacked and flipped chips when more than two chips are stacked.

The short interconnect of through hole vias provides less inductance, capacitance, and resistance so that signal integrity of the MCP is better than if bonding wire had been used. In addition to this, due to the low profile since spacers are not used, the size of package can be minimized compared to an equivalent package using bonding wire.

An embodiment of the present invention provides a method for stacking integrated circuits using through chip via holes instead of bonding wire.

Unlike the multi-drop case, serially connected multiple components in a single package provide a different approach to connecting the output of a previous device to the input of a present device to make serial connection between output and input ports.

An embodiment of the present invention provides a method for making serially connected multi-chip devices. Advantageously, the present technique provides a method to make short line connections using the through-silicon-via method. The term "serial connection" and variations thereof as used herein represent any connection facilitating a daisy chain or ring topology connection. In a ring topology of serially connected chips, the last chip can loop back to the controller.

Figure 1:
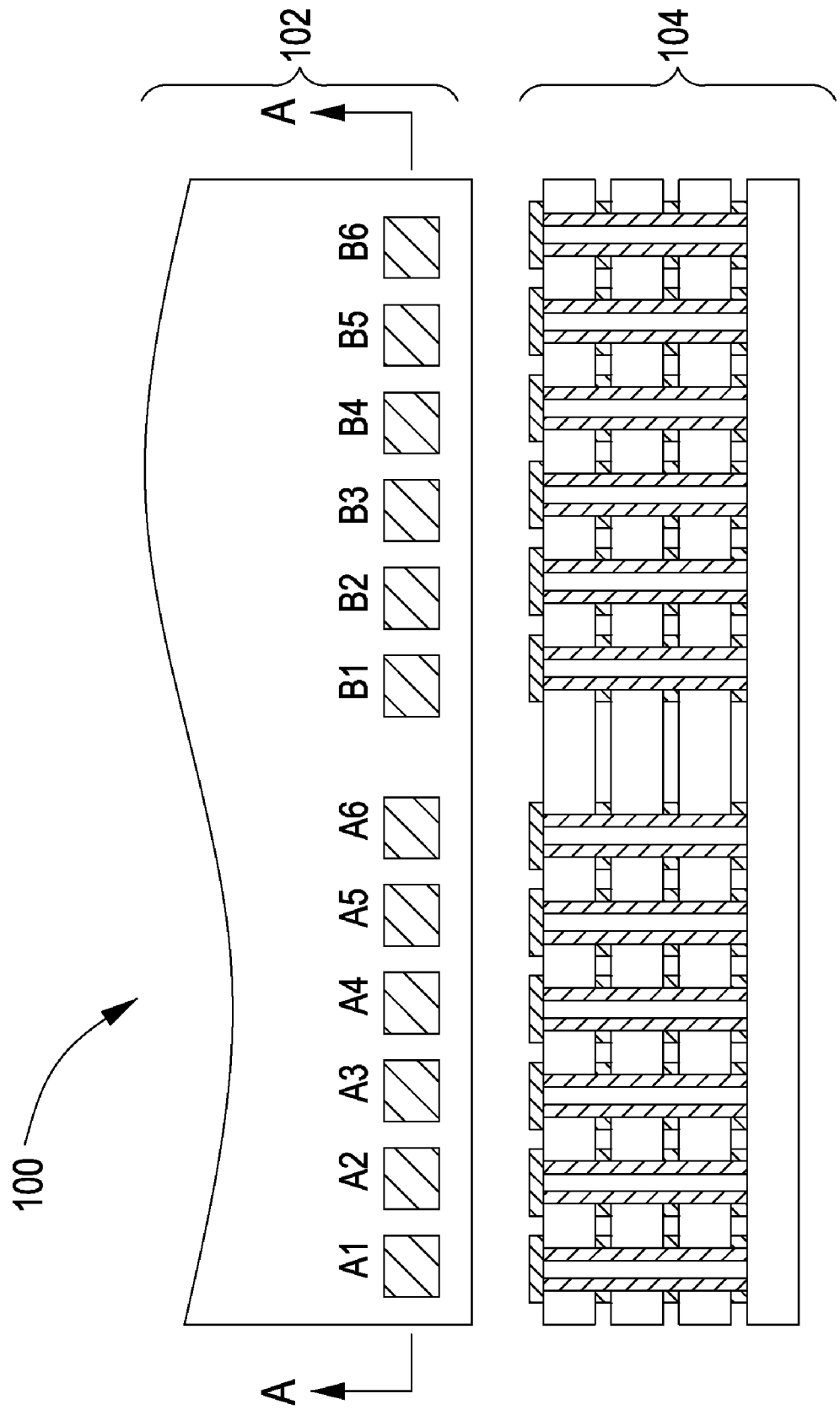
FIG. 1 shows a partial top view and cross-section view of a conventional multi-chip stack.
Figure 2:
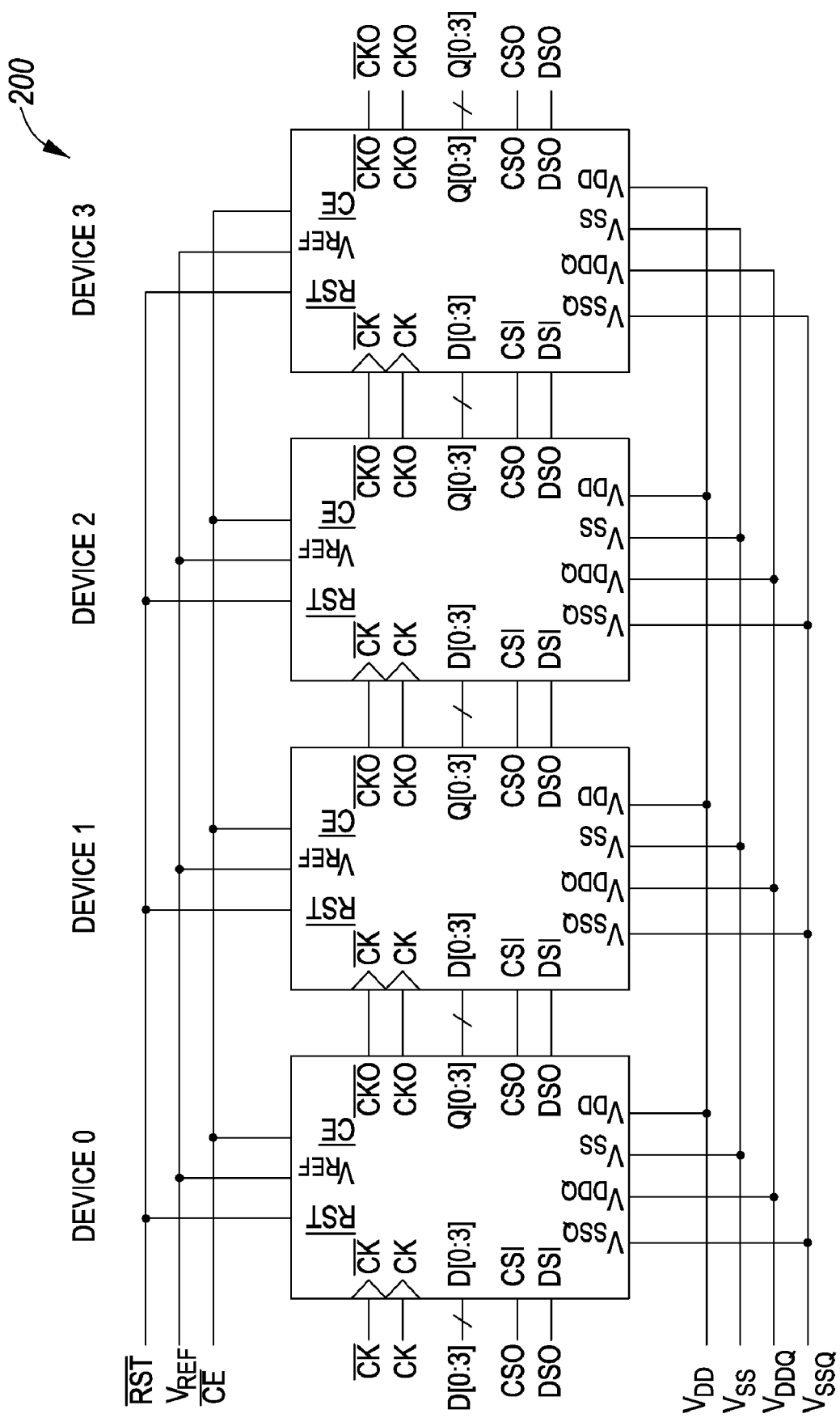
FIG. 2 is schematic drawing of an exemplary circuit suitable for fabrication in accordance with an embodiment of the present invention.

Referring now to FIG. 2 there is shown schematically a circuit 200 including serially connected integrated circuits. This circuit 200 includes a four chip flash memory circuit and is used as an example for descriptive purposes. The present technique is also applicable to dynamic random access memory (DRAM), static random access memory (SRAM), application specific integrated circuit (ASIC), a central processing unit (CPU) or any other type of multi-chip circuit having a serial connection topology similar to that described herein below.

Each chip in the circuit 200 includes connect signals that can be classified as one of three connect signal types as follows:

Common connected signals: $\overline{RST}$, $\overline{CE}$, VREF, and power supplies (VDD, VSS, etc.).
Serial input signals: $\overline{CK}$/CK, D[0:3], CSI, and DSI.
Serial output signals: $\overline{CKO}$/CKO, Q[0:3], CSO and DSO.

In other words, some of the parallel, or common connected, signals can include clock, reset, and chip select. The signals shown in FIG. 2 are examples, and one of ordinary skill in the art will appreciate that other signals can be appropriately placed into one of these groups based on the properties and connection requirements of the signal.

One embodiment of the present invention has a parallel connected clock. However, in another embodiment, a serial connection is used for the clock. Power must be parallel. Input and output signals, or signal pads, can be daisy-chained for any type of RAM, any logic, or even a CPU according to an embodiment of the present invention.

Figure 3A:
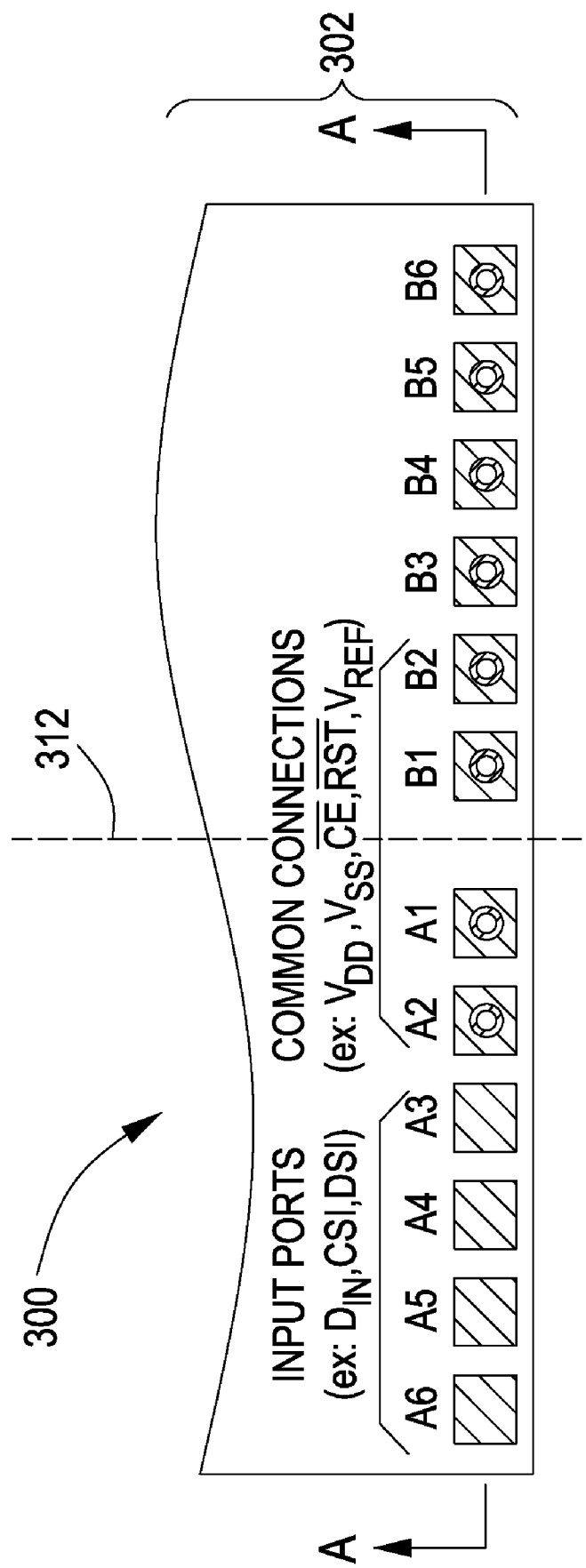
FIGS. 3A-3C provide a partial top view, cross-section front view, and partial bottom view, respectively, of a simplified orthographic representation including an embodiment of the circuit shown in FIG. 2.
Figure 3B:
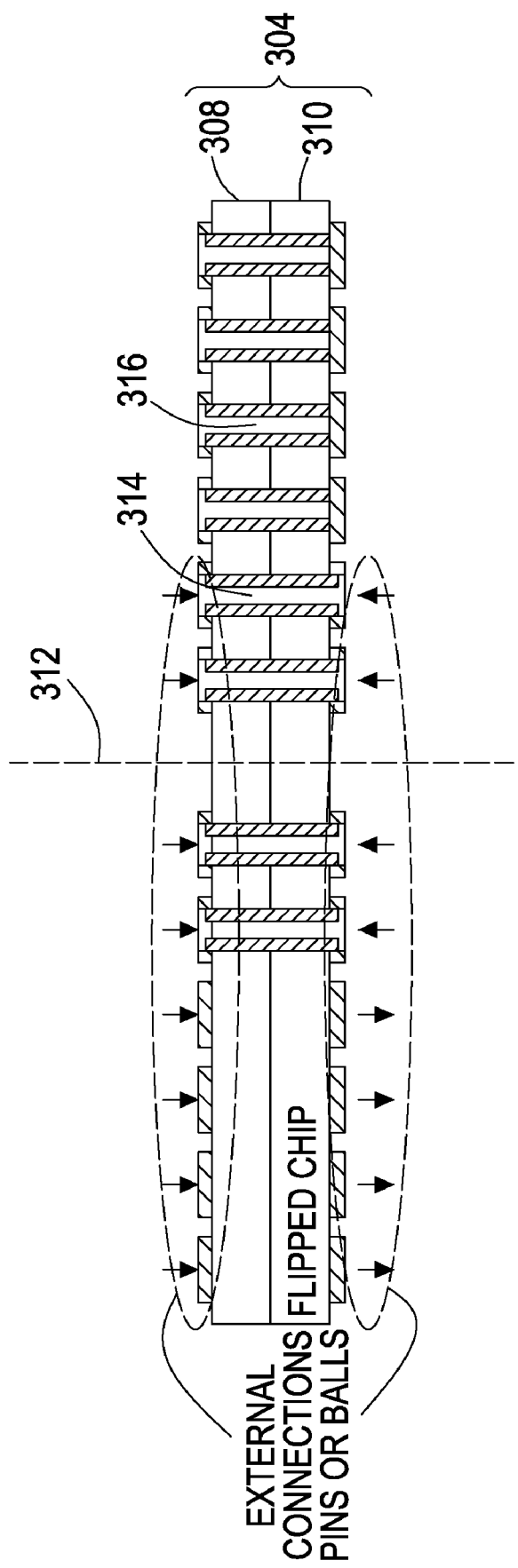
Figure 3C:
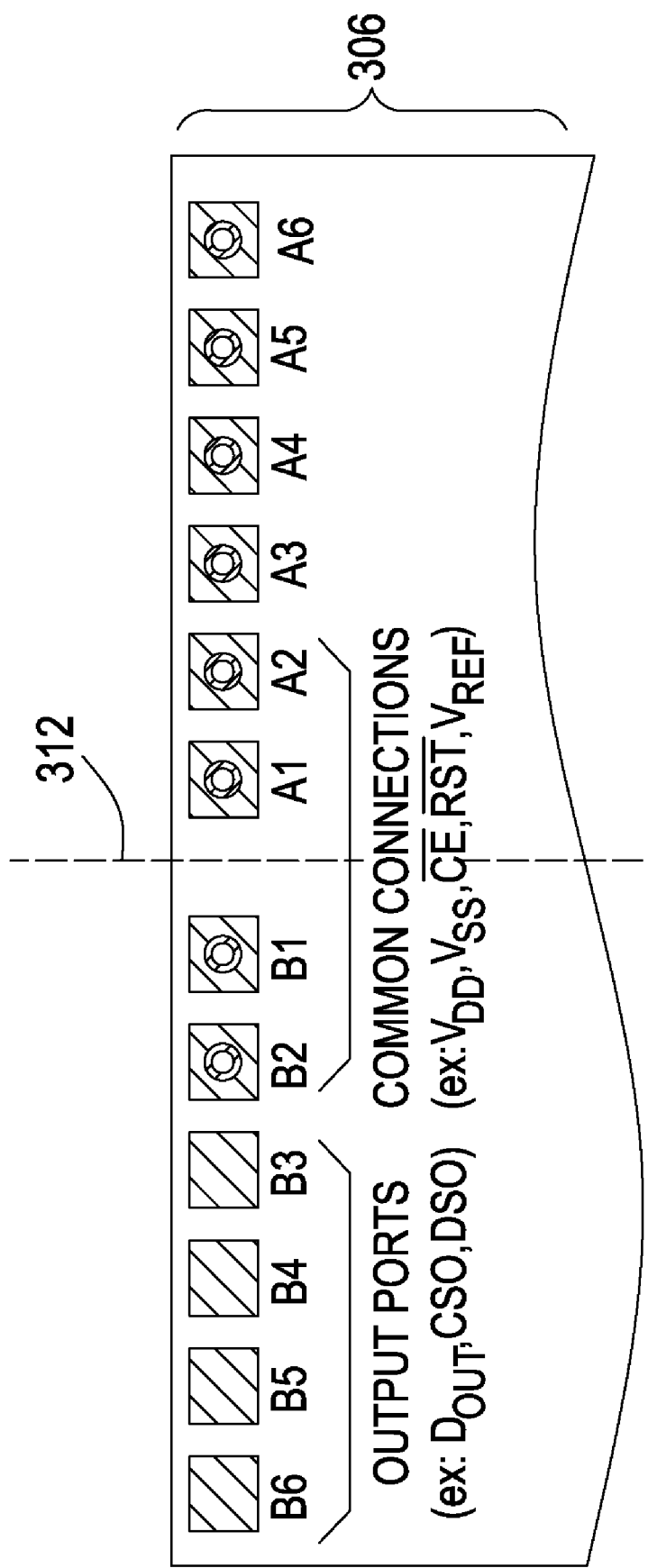

Referring to FIGS. 3A-3C, there is shown a simplified orthographic representation 300 including a partial top view 302 (in FIG. 3A) a cross-section front view 304 (in FIG. 3B), and a partial bottom view 306 (in FIG. 3C) of an embodiment of the circuit 200 shown in FIG. 2. For clarity, only a subset of the connect signals is shown. In this embodiment, two substantially identical chips are stacked and connected.

As shown in FIG. 3B, which is a cross-section taken along line A-A in FIG. 3A, the pair of stacked integrated circuit chips includes a top chip 308 and a bottom chip 310. The bottom chip 310 has a substantially identical signal pad arrangement as the top chip 308, and is flipped in orientation with respect to the top chip. As shown in FIGS. 3A and 3C, each chip includes one or more input signal pads A3-A6 for connection to external input signals. One or more common connection signal pads A1-A2 are provided, with each common connection signal pad being symmetrically disposed about a center line 312 of the top chip with respect to a duplicate common signal pad B1-B2. One or more output signal pads B3-B6 are symmetrically disposed about the center line of the chip with respect to respective, or corresponding, input signal pads A3-A6.

Referring back to FIG. 3B, a parallel connection through-chip via 314 connects a top chip common connection signal pad in parallel with its duplicate common connection signal pad. A serial connection through-chip via 316 connects a top chip output signal pad in series with its respective, or corresponding, input signal pad on the bottom chip.

When the different views 302, 304 and 306 in FIGS. 3A-3C are lined up together, they illustrate how the common connection pads on the top and bottom chips line up with one another when stacked, and how the input signal pads of the top chip line up with their corresponding output signal pads on the bottom chip. This is particularly evident when observing the pads from views 302 and 306 that are vertically aligned with one another. The arrangement of signal pads permits the use of through-chip vias for both parallel and serial, or daisy chain, connections in the same multi-chip package.

In an embodiment, the stacked chips are aligned so there is substantially no offset. For example, an edge of a top chip lines up vertically with a corresponding edge of the bottom chip. In an embodiment, all of the edges of a top chip can line up vertically with all of the corresponding edges of the bottom chip. In another embodiment, the stacked chips face the same direction as one another. For example, a side of the first chip having selected signal pads faces the same direction as a side of the second chip having the same selected signal pads. These relationships described in relation to a top chip and a bottom chip can also describe adjacent chips in an embodiment of the present invention having a plurality of stacked chips.

Figure 4:
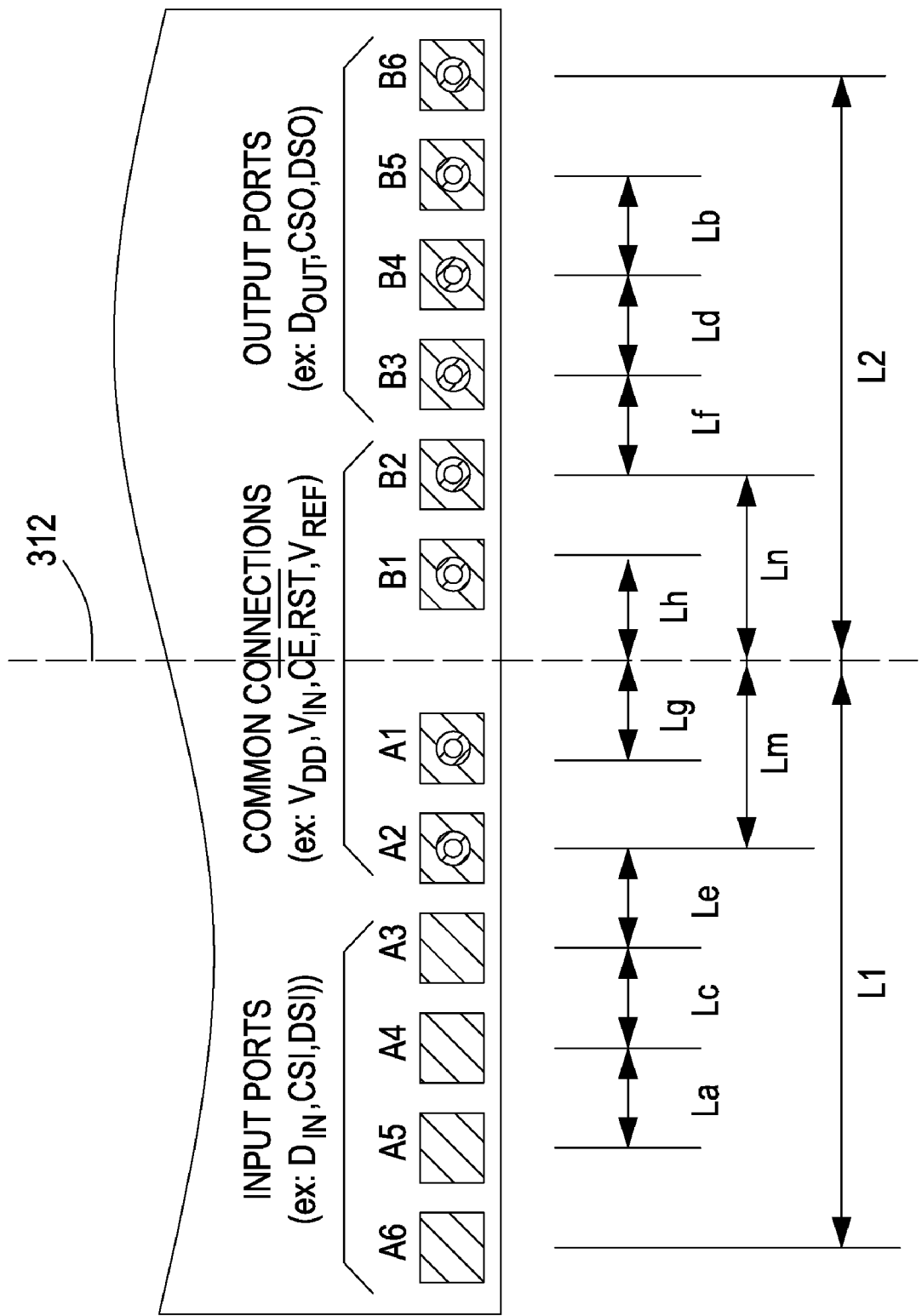
FIG. 4 is another simplified partial top view of the embodiment of FIG. 3.

FIG. 4 illustrates another partial top view of the embodiment shown in FIGS. 3A-3C describing in further detail the key geometric relationships between signal pads in a chip. Specifying the location of the pads on the chip enables the daisy chain and parallel connections with a substantially identical flipped chip using through-chip vias. Signal pads A3-A6 are mirror images of the signal pads B3-B6 about the center line 312 of the chip, and vice versa. The signal pads A3-A6 and B3-B6 can be serial input pads and serial output pads, respectively. Common connection pads A1 and A2 are duplicated and mirror images of their respective duplicates B1 and B2 about the center line of the chip. Signal pads A1 and B1 carry the same signal as each other, and signal pads A2 and B2 carry the same signal as each other.

Further describing the pad arrangement in the embodiment of FIG. 4, input pad A6 is provided at a distance L1 from the center line of the chip. The related, or corresponding, output pad B6 is provided at a distance L2 from the center line of the chip, with L1=L2. Similarly, common connection pads A1 and A2 are respectively provided at a distance Lg and Lm from the center line, and their duplicate common connection pads B1 and B2 are respectively provided at a distance Lh and Ln from the center line, with Lg=Lh and Lm=Ln.

Input pad A5 is separated from input pad A4 by a distance La. Output pad B5 is separated from output pad B4 by a distance Lb, which is equal to La. Similarly for other inter-pad distances shown in FIG. 4, Lc=Ld and Le=Lf.

When only two chips are stacked according to an embodiment of the present invention, there is some flexibility in the placement or arrangement of the pads. In the embodiment shown in FIG. 4, the pads on one side of the center line are all inputs, and the pads on the other side are all outputs. In another embodiment, input ports and output ports can be provided on either side or both sides of the center line of the chip. In that case, each input port is on the opposite side of the center line from its corresponding output port and each input and output port in a pair is separated from the center line by the same distance. The input pads and output pads can be grouped together, but their relative placement and separation distance in each group is not as strictly governed as when there are multiple stacked chips.

Figure 5A:
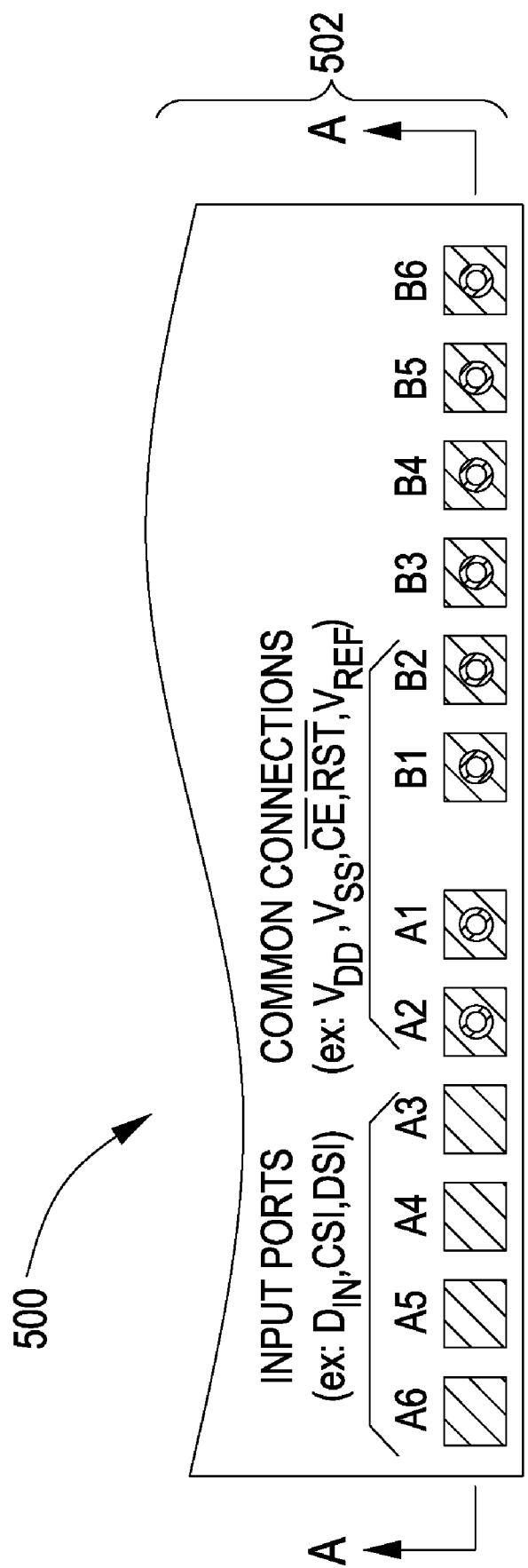
FIGS. 5A-5C provide a partial top view, cross-section front view, and partial bottom view, respectively of a simplified orthographic representation including another embodiment of the circuit shown in FIG. 2.
Figure 5B:
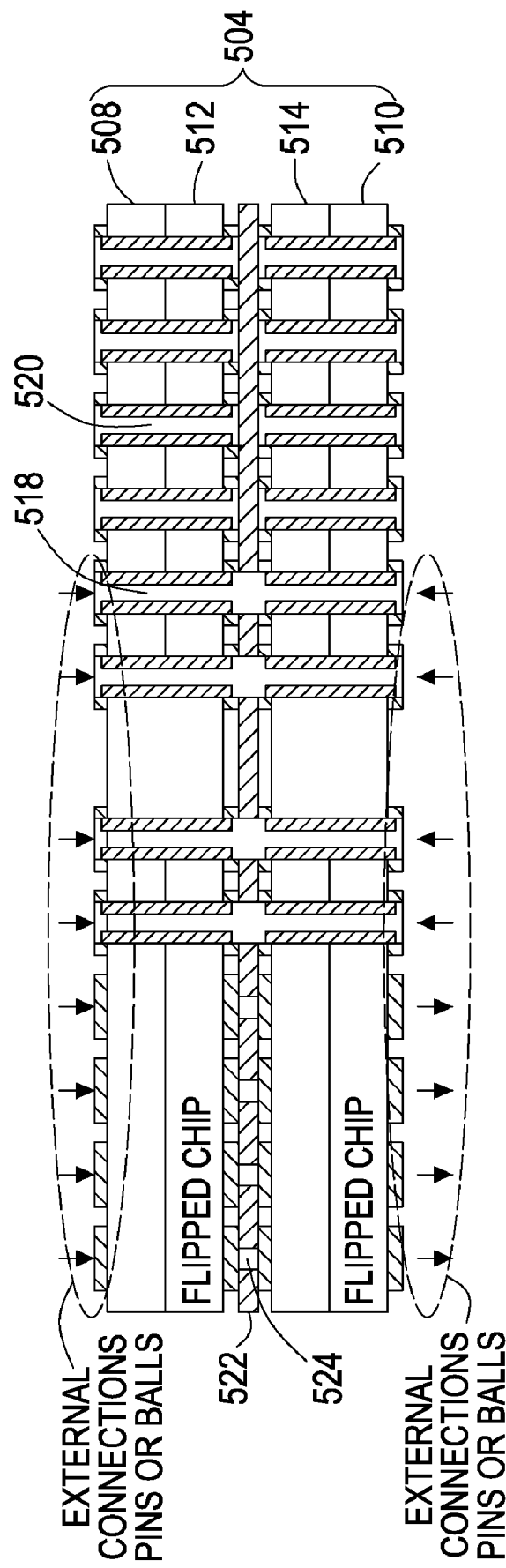
Figure 5C:
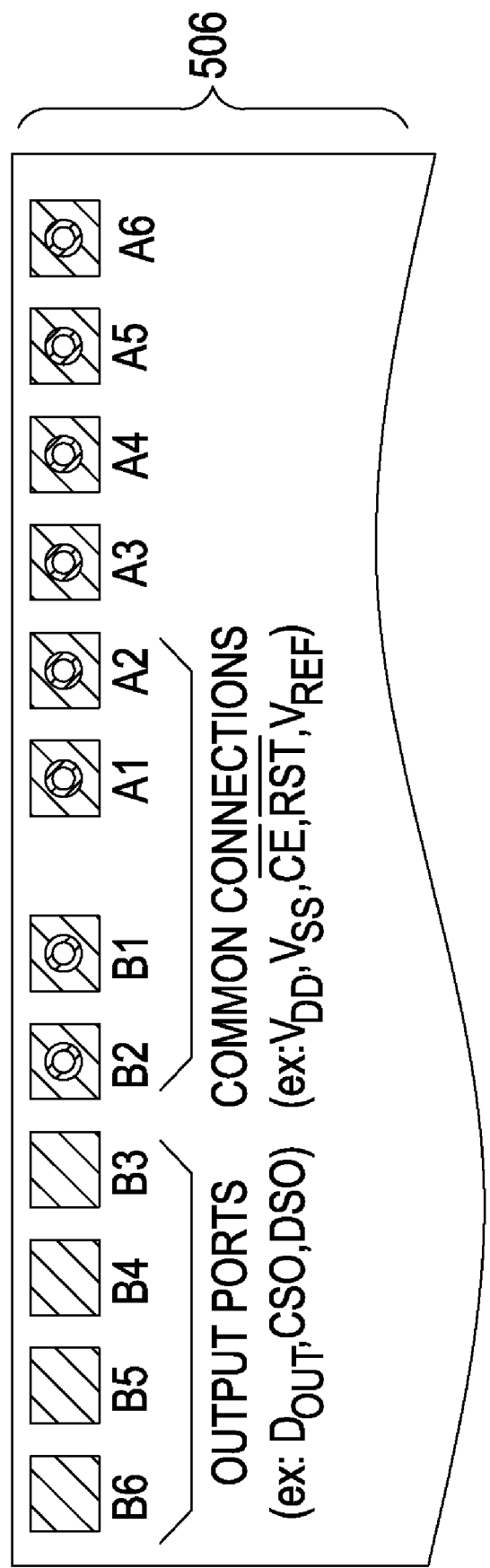

FIGS. 5A-5C illustrate a simplified orthographic representation 500, including a partial top view 502 (in FIG. 5A), a cross-section front view 504 (in FIG. 5B), and a partial bottom view (in FIG. 5C) of another embodiment of the circuit 200 shown in FIG. 2. As is evident from FIG. 5B, this embodiment shows an even multiplicity of chips in the multi-chip circuit or package, such as a plurality of pairs of stacked chips. Each alternating chip in the stack is flipped in orientation with respect an adjacent chip.

The embodiment shown in FIG. 5B has a plurality of substantially identical chips including a top chip 508, a bottom chip 510, and an even number of intermediate chips. In this case, there is a first intermediate chip 512 and a second intermediate chip 514. Each chip in the stack has substantially identical signal pad arrangements and has similar properties as the chips described in relation to FIG. 3. In this embodiment, the multi-chip package has at least one parallel through-chip via, at least one serial through-chip via, and at least one serial connection between pads of stacked and flipped chips.

The input signal pads A3-A6 and common connection signal pads A1-A2 and B1-B2 (shown in FIG. 5A) of the top chip 508 are for connection to external input signals and external common signals, respectively. One or more of the output signal pads of the top chip are connected to respective input signal pads of an adjacent chip, as will be described in further detail below.

The output signal pads B3-B6 and common connection signal pads A1-A2 and B1-B2 of the bottom chip 510 (shown in FIG. 5C) are for connection to external output signals and external common signals, respectively. One or more of the input signal pads of the bottom chip are connected to respective output signal pads of an adjacent chip, as will be described in further detail below.

At least one of the intermediate chips has one or more of its output signal pads connected to respective one or more input signal pads of an adjacent intermediate chip.

In the embodiment shown in FIG. 5B, an insulator 522 is provided to prevent a short between adjacent pads that are not supposed to make a contact with one another. The insulator can be disposed between pads of adjacent intermediate chips to prevent contact between selected adjacent pads, such as those between which a connection is not desired. Respective chip-to-chip common connections are made using co-linear through pad, chip, and insulator vias 518. The parallel connection through-chip via in this case extends through the insulator 522 and through the corresponding common connection signal pads of the intermediate chips.

Respective serial connections between output ports and input ports are made using through chip vias 520 or through pad vias 524. In order to ensure connection in the presence of an insulator, a through-pad via 524 extends through the insulator to connect the one or more output signal pads of the intermediate chips to respective one or more input signal pads of adjacent chips. As mentioned earlier, the serial connections can facilitate daisy chain or loop topology connections.

In an embodiment (not shown) where the insulator is absent, the pads for the input and output can physically touch each other to make connections for "intermediate" chips in the stack.

In terms of serial connections using through-chip vias, the inputs and outputs of first two devices in the stack are connected together, but the second and third devices are not connected together using through-chip vias, and insulation is provided between them. Then the third and fourth devices are connected together using through-chip vias. Through-pad vias extending through the insulator are provided to make desired serial connections between the second and third devices.

The input and output ports on the top and bottom chips in the stack are not connected to other pads, but to the appropriate external connections. The power connection will also come from external, and have a direct parallel connection through the stack using a through-chip via.

Also note that the external connections to the common connections are shown on both the top and bottom chips of the stack. However, any advantageous combination of top, bottom, or both connections is within the present technique. For example, in another embodiment (not shown), signals such as $\overline{CE}$, $\overline{RST}$, and VREF have a single top or bottom connection while power supplies such as VDD, VSS, VDDQ, and VSSQ have both top and bottom connections.

In an aspect, the present invention provides a multi-chip device comprising a plurality of substantially identical chips. Each chip includes one or more common connect signal pads wherein each signal pad is symmetrically disposed on a center line of the chip or symmetrically disposed about the center line of the chip with respect to a duplicate common signal pad. One or more input signal pads are also provided in each chip, as well as one or more output signal pads. The output signal pads are symmetrically disposed about the center line of the chip with respect to the respective input signal pads. Each common connect signal pad on each chip is connected to respective common connect signal pads on the other chips by co-linear through chip vias.

In this aspect, the plurality of substantially identical chips includes a top chip and a bottom chip. The top chip has the one or more input signal pads for connection to external input signals, the common connection signals for connection to external common signals, and the one or more output signal pads connected to respective input signal pads of an adjacent chip. The bottom chip has the one or more output signal pads for connection to external output signals, the common connection signals for connection to the external common signals and the one or more input signal pads connected to respective output signal pads of and adjacent chip. An even number of middle chips have the one or more output signal pads connected to respective one or more input signal pads of adjacent chips.

Figure 6A:
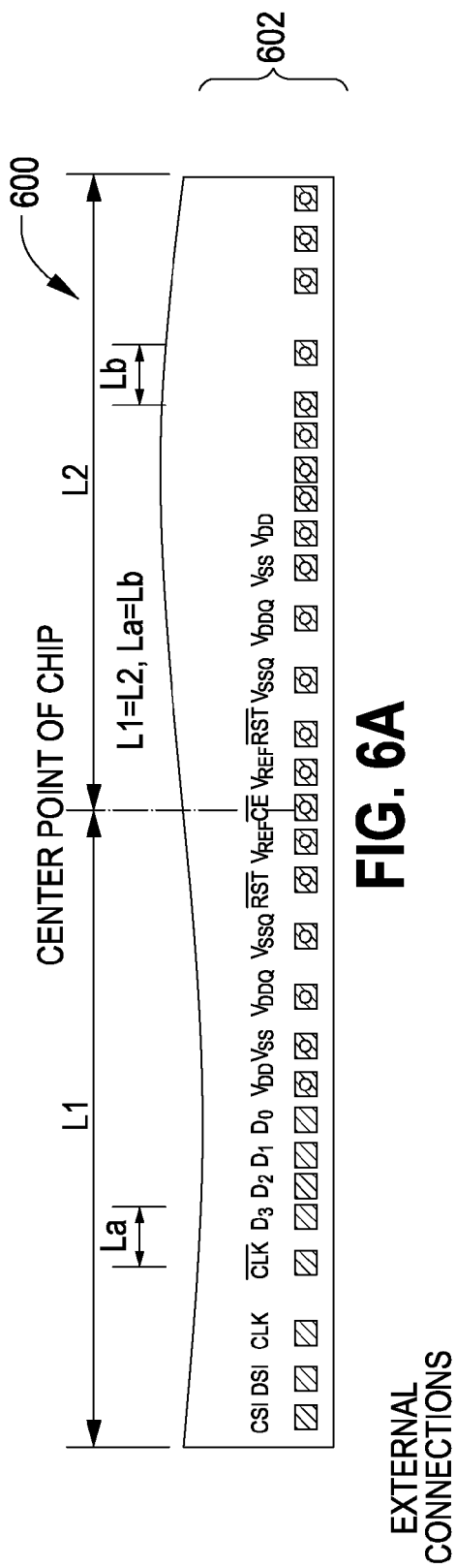
FIGS. 6A-6C provide a detailed partial top view, cross-section front, and bottom view, respectively, of the embodiment of the circuit in FIG. 2.
Figure 6B:
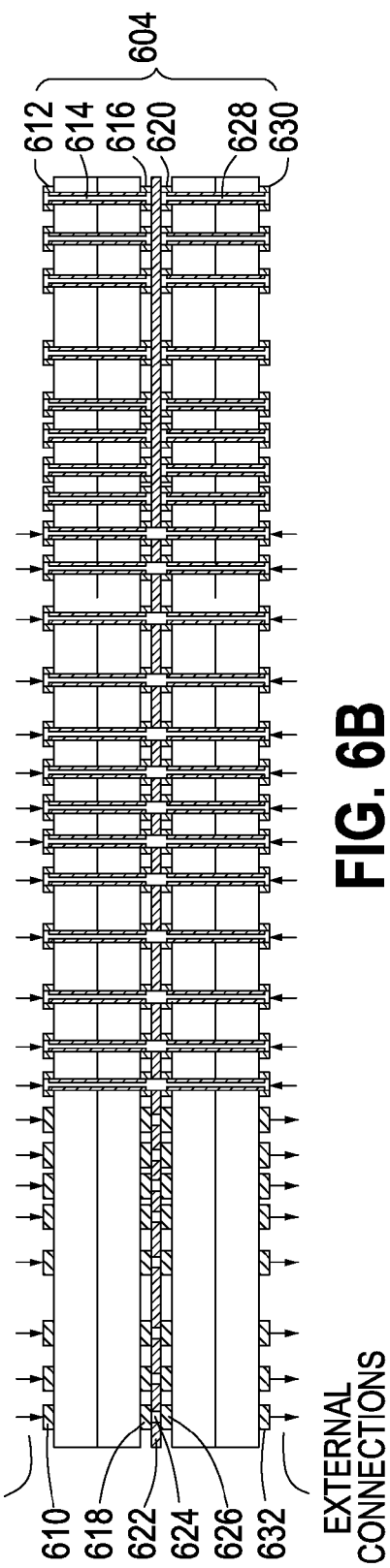
Figure 6C:
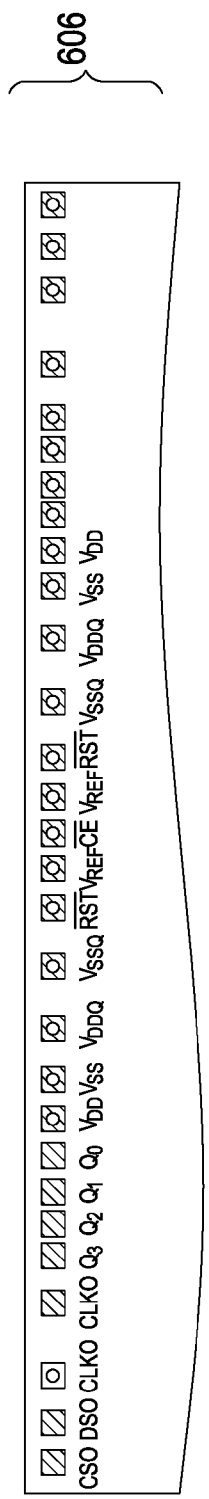

FIGS. 6A-6C illustrate a simplified orthographic representation 500, including a detailed partial top view 602 (in FIG. 6A), a cross-section front view 604 (in FIG. 6B), and a partial bottom view 606 (in FIG. 6C) of a multi-chip package 600, which is an embodiment of the circuit 200 shown in FIG. 2. All of the connect signals are shown. Note that since $\overline{CE}$ is symmetrically disposed on a center line of the chip, it is not duplicated. An exemplary serial or daisy chain connection between input pad CSI (Common Strobe Input) on the top chip and output port CSO (Common Strobe Output) on the bottom chip will be described. This provides further details on serial or daisy chain connections in a stack with four chips, or any higher even number of chips.

As seen in FIG. 6B, an external connection carries the common strobe input signal into CSI pad 610 on the top chip. CSO pad 612 within the top chip carries the corresponding output signal. A through-chip via 614 takes the output from CSO pad 612 and connects it as the input to the CSI pad 616 of the first intermediate chip. CSO pad 618 within the first intermediate chip carries the output signal.

The CSO pad 620 of the second intermediate chip is isolated from the CSI pad 614 of the first intermediate chip by the insulator 622 to prevent connection between those two adjacent pads in the stack. A through-pad via 624 takes the output from CSO pad 618 of the first intermediate chip and connects it as the input to the CSI pad 626 of the second intermediate chip. CSO pad 620 within second intermediate chip carries the corresponding output signal.

A through-chip via 628 takes the output from CSO pad 620 and connects it as the input to the CSI pad 630 of the bottom chip. CSO pad 632 in the bottom chip carries the output signal to an external connection.

In an embodiment, the common connection pads include one or more power pads, the number of which is sufficient to supply enough operation current and stable voltage level when simultaneous input and output buffers are executed.

Figure 7:
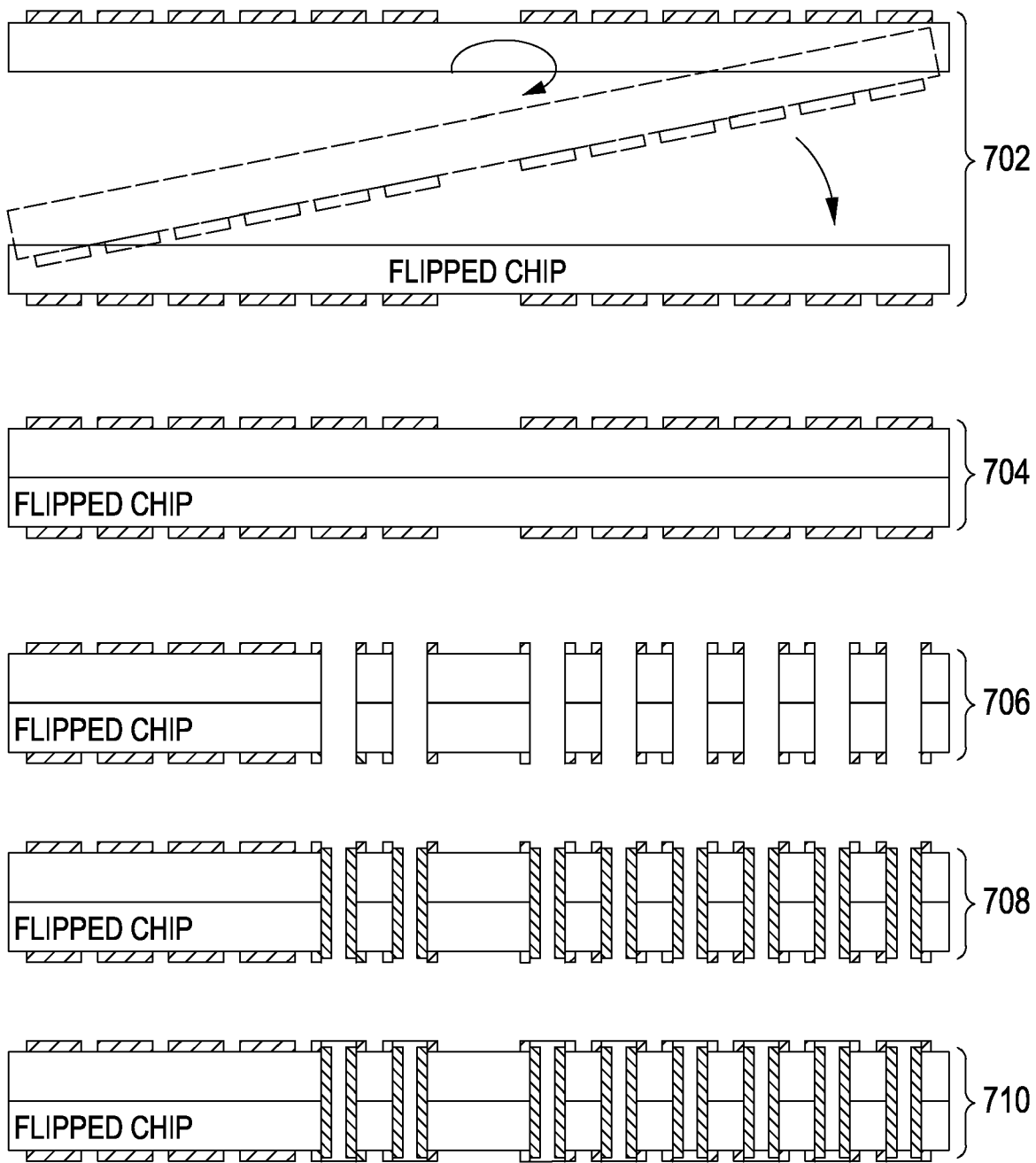
FIGS. 7 and 8 show steps of a method of fabricating the embodiment shown in FIG. 6 in accordance with the present technique.
Figure 8:
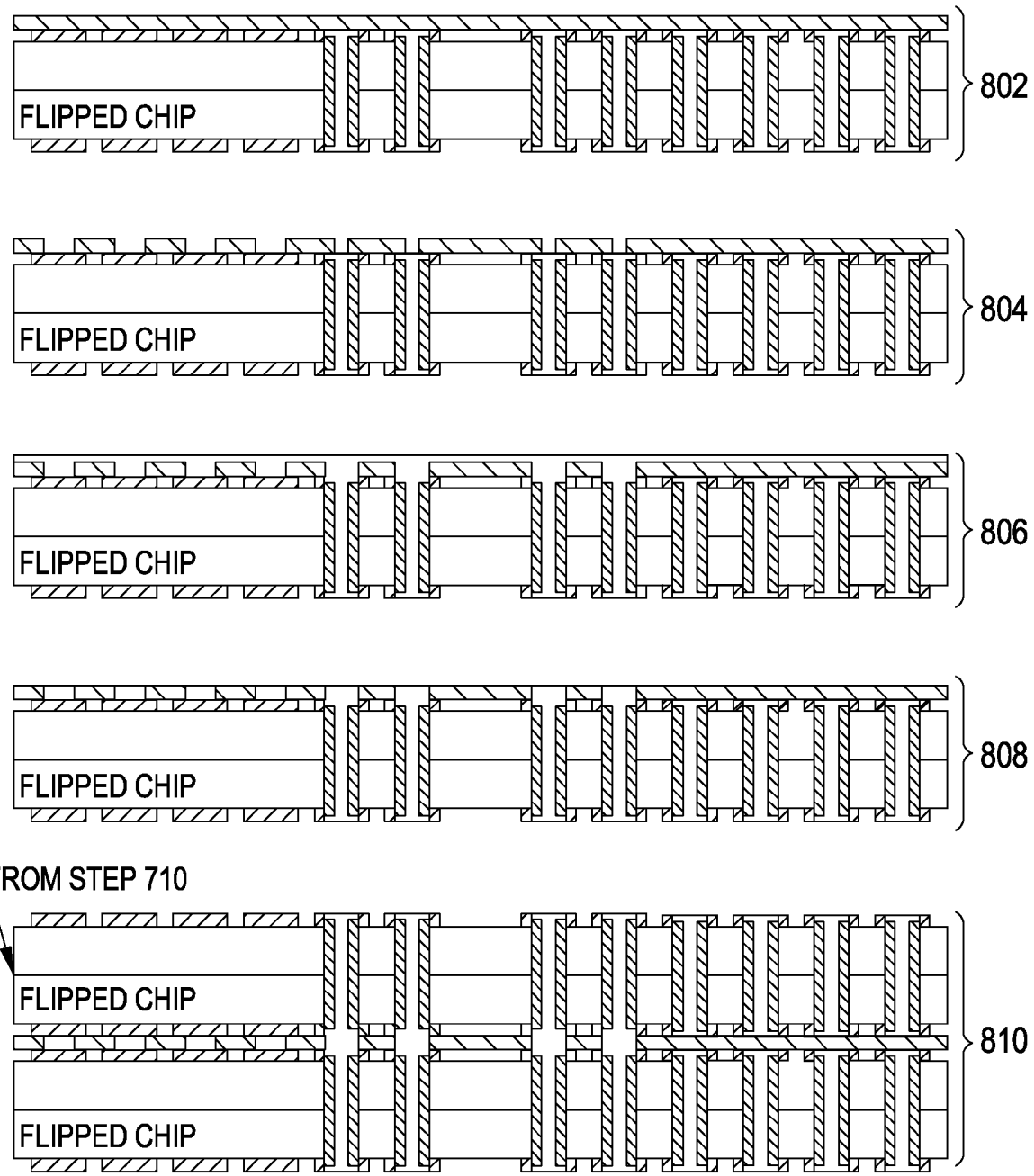

FIGS. 7 and 8 show steps in a method of fabricating a multi-chip device according to an embodiment of the present invention. By flipping alternating chips, the top sides of each chip, which is a surface formed with transistors, face opposite each other and the two pads are vertically connected to each other with a through-chip via, such as a through-silicon via. After making a first connection for two chips, an insulation layer is deposited to prevent any electrical shorts between pads of two combined multi-chips (total of 4 chips). FIG. 7 illustrates steps for fabricating a stacked pair of integrated circuit chips, while FIG. 8 illustrates further steps in fabricating a multi-chip device having a plurality of pairs of stacked chips, or pairs of combined chips.

In FIG. 7, step 702 shows that a first chip is flipped so that its top side bearing transistors faces in a first direction, such as down, to become a bottom chip. In step 704, a second chip is placed on top of the flipped first chip, the second chip being substantially identical in pad arrangement and placement to the first chip. In step 706, through pad and chip via holes are created to facilitate connection of signal pads of the top chip to corresponding signal pads of the bottom chip to create at least one series connection and at least one parallel connection.

Because of the substantially identical signal pad arrangement of the two chips, step 706 can include creating a first through-chip and through-pad via hole to facilitate connection between a top chip common connection signal pad in parallel with its duplicate common connection signal pad. Step 706 can further include creating a second through-chip and through-pad via hole to facilitate connection between a top chip output signal pad in series with its respective input signal pad on the bottom chip.

In step 708, an insulation layer is disposed in the via holes. In step 710, a conductor (e.g. copper) is disposed in the via holes to create the through-via connections between the pads on the top chip and the bottom chip. In an embodiment, at the end of step 710, a pair of stacked chips has been fabricated, the stack including at least one parallel connection through-chip via connecting a top chip common connection signal pad in parallel with its duplicate common connection signal pad, and at least one serial connection through-chip via connecting a top chip output signal pad in series with its respective input signal pad on the bottom chip.

Turning to FIG. 8, further steps are shown in a method of fabricating a multi-chip device having two pairs of stacked chips. In step 802, an insulation layer is deposited on top of the first stacked pair of integrated circuit chips. In step 804, contact holes are formed in the insulation layer to permit connection between certain adjacent signal pads when another chip is later placed on top. In step 806, a conductor is filled, or deposited, into the contact holes formed in the previous step. In step 808, a conductor layer is etched so that excess conductor material is removed from the portions outside the contact holes. In step 810, two previously combined chips, fabricated in accordance with the steps 702-710 in FIG. 7, are attached on top of the first stacked pair of integrated circuit chips to create a multi-chip circuit for a multi-chip package.

In an embodiment, a method for stacking serially-connected integrated circuits comprises the following steps: flipping a first chip; placing second chip on first chip; making through pad and chip via holes on common connections and output port of the second chip; disposing an insulation layer in the via holes; disposing a conductor in the via holes (ex. copper); depositing an insulation layer; forming contact holes in the insulating layer; filling conductor into the contact holes; etching a conductor layer; and attaching the two chips to previously combined chips.

Figure 9:
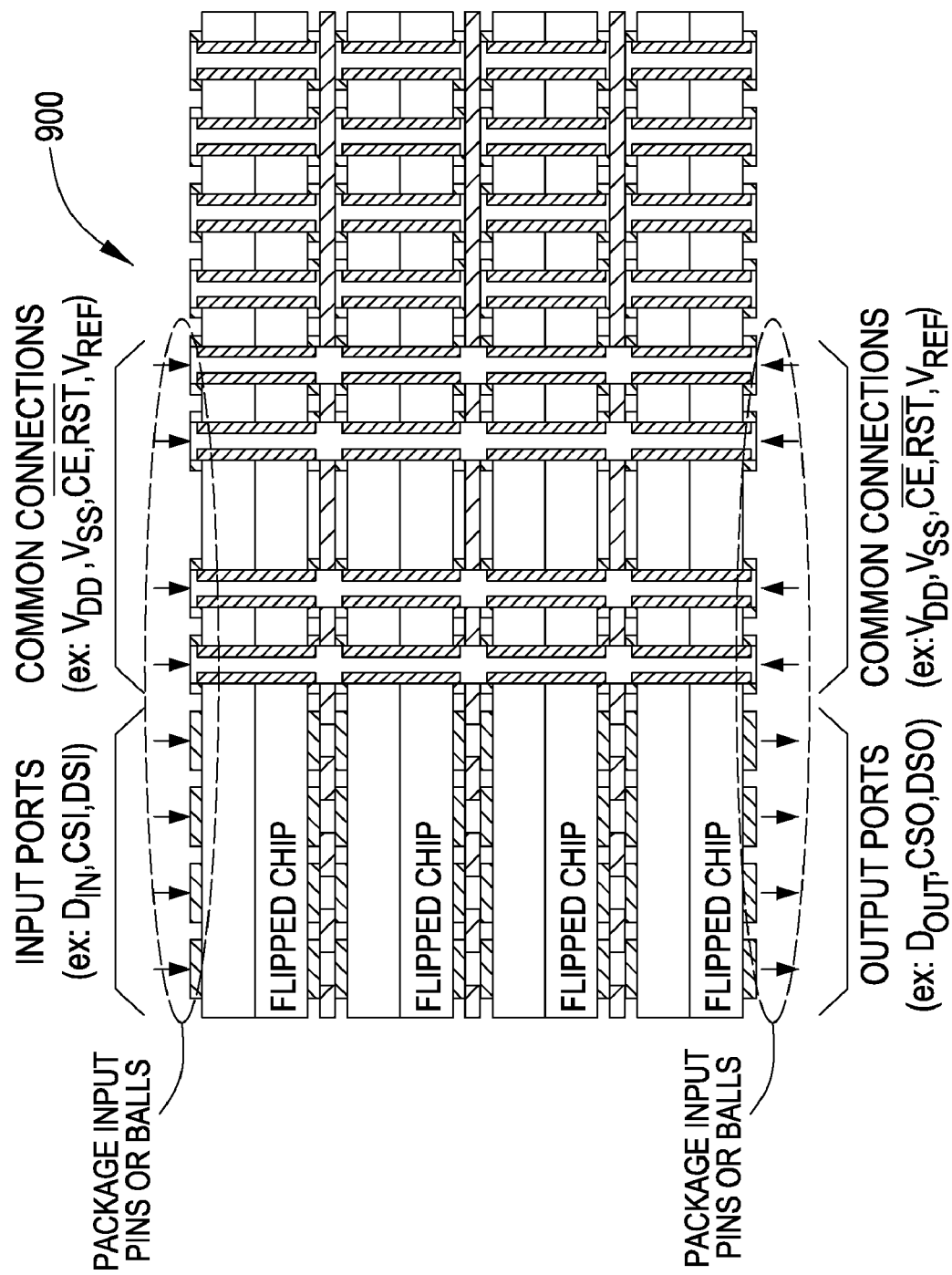
FIG. 9 is a front cross-section view of another multi-chip circuit in accordance with an embodiment of the present invention.

FIG. 9 is a front view of another circuit 900 in accordance with an embodiment of the present invention. In this embodiment, there are eight chips in the stack forming the multi-chip circuit. The top, bottom and intermediate chips have connections between them and within the stack similar to described in relation to FIGS. 5 and 6. As shown in FIG. 9, the stack of identical chips has external connections either to a package input and output, or to pins or balls, such as a ball grid array (BGA). For example, the circuit can get to the pin, or lead frame on the package, with more bonding wires or a ball grid. The BGA is well known in the memory industry for providing high performance, such as for CPU packages. The ball grid is the system bus and can be used with parallel or serial (daisy chain) connections. BGA provides less capacitance and loading compared to pin-based or TSOP (thin small-outline package) connections. DDR2 and DDR3 and other high speed devices use BGA. BGA is used for interfacing with the outside, and not for inter-chip connection.

Figure 10:
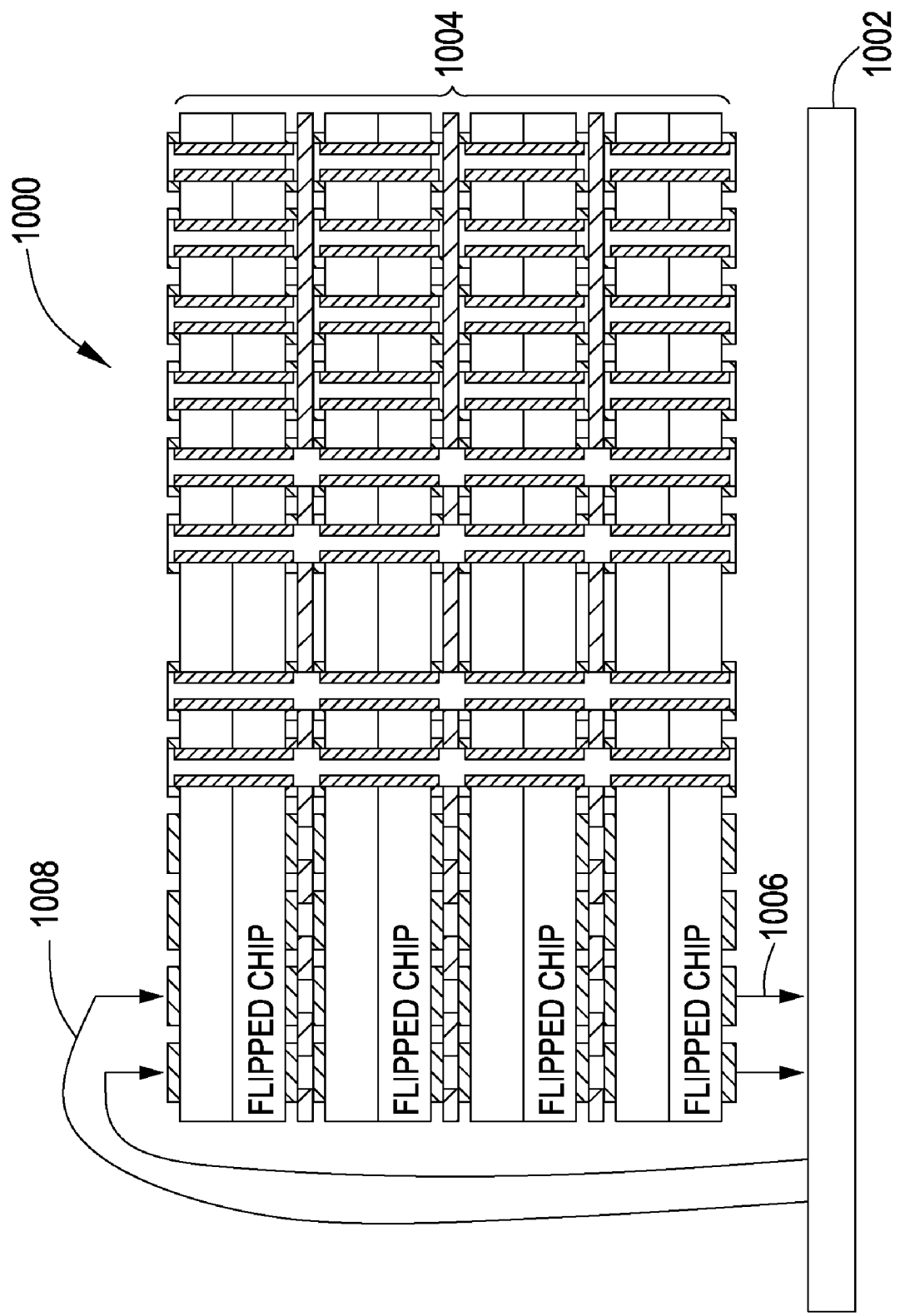
FIG. 10 is a front cross-section view of a multi-chip package in accordance with another embodiment of the present invention.

FIG. 10 illustrates a front cross-section view of a multi-chip package 1000 according to another embodiment of the present invention. In accordance with aspects of the invention, a memory system having a plurality of cascaded memory devices is provided. The memory devices can be serially connected, and an external memory controller can receive and provide data and control signals to the memory system. A similar arrangement is described in commonly assigned United States Patent Application Publication No. 2007/0076479-A1 entitled "Multiple Independent Serial Link Memory", published on Apr. 5, 2007 and filed on Dec. 30, 2005, which is incorporated herein by reference.

When using embodiments of the present invention for certain types of memory, such as NAND Flash, it is desirable to provide a memory controller in the same package and stacked with the other memory chips. For many types of memory chips (e.g. DRAM, SRAM or other logic), such as shown in FIG. 9, a controller will not be incorporated together with the stacked chips.

In the embodiment of FIG. 10, a controller 1002 is placed below the stacked chips 1004. Output signal pads from the memory are connected by way of controller input connections 1006 to the input side of the controller. The controller input connections 1006 can be wire bonding, vias, a ball grid or any other suitable connection. The output side of the controller is connected by way of controller output connections 1008 to the input pads of the top chip of the memory stack. The controller output connections 1008 can be wire bonding or any other suitable connection. Only a few representative connections are shown in FIG. 10 to illustrate the type and nature of connection.

In another embodiment (not shown), the controller can be placed on top to connect the output side of the controller to the input side of the memory. Suitable controller output connections are provided to make those connections, and suitable controller input connections are provided to connect the output side of the memory stack to the input of the controller. In such an embodiment, a loop connection can be facilitated by the serial connections in the stack, where the last device loops back to the controller.

In fabricating the multi-chip package, the creation of through-chip vias as described in relation to FIGS. 7 and 8 are some of the steps in the manufacturing process. Additional steps can be included when a controller is involved. In a package (or packaging) step, controller input and output connections are added. This can comprise adding wire bonding to connect the controller outputs to the memory inputs, or vice versa. A further step includes covering the entire package or compound.

The chips illustrated in FIGS. 3 to 10 are fabricated using silicon substrate technology. However, embodiments fabricated using gallium-arsenide, germanium, silicon-germanium or any other substrate technologies are within the present technique.

Note that the pads are disposed along a single edge of the chip in the embodiments shown in FIGS. 3 to 10 for clarity and ease of illustration. The pads may be disposed along two, three, or four edges of the chip and still be within the present technique.

The physical dimensions or proportions of the chips shown in FIGS. 2 to 10 are not drawn to scale. Some dimensions are exaggerated or diminished for clarity of illustration.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A multi-chip device including a stacked pair of integrated circuit chips comprising:
    a top chip having:
        one or more input signal pads for connection to external input signals;
        one or more common connection signal pads, each common connection signal pad being symmetrically disposed about a center line of the top chip with respect to a duplicate common connection signal pad;
        one or more output signal pads symmetrically disposed about the center line of the top chip with respect to respective input signal pads;
    a bottom chip having a substantially identical signal pad arrangement as the top chip, the bottom chip being flipped in orientation with respect to the top chip;
    a parallel connection through-chip via connecting a top chip common connection signal pad in parallel with its duplicate common connection signal pad; and
    a serial connection through-chip via connecting a top chip output signal pad in series with its respective input signal pad on the bottom chip.

2. The device of claim 1 wherein the one or more input signal pads, the one or more common connection signal pads and the one or more output signal pads are disposed along a single edge of the top chip.

3. The device of claim 1 further comprising a plurality of serial connection through-chip vias connecting top chip output signal pads in series with their respective input signal pads on the bottom chip.

4. The device of claim 1 further comprising a plurality of parallel connection through-chip vias connecting top chip common connection signal pads in parallel with their duplicate common connection signal pads on the bottom chip.

5. The device of claim 1 wherein the one or more input signal pads are disposed on the same side of the center line of the top chip.

6. The device of claim 1 wherein the top chip and the bottom chip are aligned so there is substantially no offset.

7. The device of claim 6 wherein an edge of the top chip lines up vertically with a corresponding edge of the bottom chip.

8. The device of claim 1 wherein the top chip and the bottom chip face the same direction as one another.

9. The device of claim 8 wherein a side of the top chip having selected signal pads faces the same direction as a side of the bottom chip having the same selected signal pads.

10. A multi-chip device comprising:
    a plurality of substantially identical chips including a top chip, an even number of intermediate chips and a bottom chip, each chip comprising:
        one or more input signal pads;
        one or more common connection signal pads, each common connection signal pad being symmetrically disposed about a center line of the chip with respect to a duplicate common connection signal pad;
        one or more output signal pads symmetrically disposed about the center line of the chip with respect to respective input signal pads;
    a parallel connection through-chip via connecting corresponding common connection signal pads on each chip together in parallel; and
    a serial connection through-chip via connecting an output signal pad on one chip in series with its respective input signal pad on another chip,
    the top chip having the one or more input signal pads for connection to external input signals, the common connection signal pads for connection to external common signals, and the one or more output signal pads connected to respective input signal pads of an adjacent chip,
    the bottom chip having the one or more output signal pads for connection to external output signals, the common connection signal pads for connection to the external common signals and the one or more input signal pads connected to respective output signal pads of an adjacent chip,
    at least one of the intermediate chips having the one or more output signal pads connected serially to respective one or more input signal pads of an adjacent intermediate chip, and
    the plurality of substantially identical chips being provided in a stack, each alternating chip in the stack being flipped in orientation with respect an adjacent chip, each chip having substantially identical signal pad arrangements.

11. The device of claim 10 wherein the even number of intermediate chips comprises a multiplicity of intermediate chips having the one or more output signal pads connected to respective one or more input signal pads of a plurality of adjacent intermediate chips.

12. The device of claim 10 further comprising an insulator disposed between pads of adjacent intermediate chips to prevent contact between selected adjacent pads.

13. The device of claim 12 wherein the parallel connection through-chip via extends through the insulator and through the corresponding common connection signal pads of the intermediate chips.

14. The device of claim 12 further comprising a through-pad via extending through the insulator to connect the one or more output signal pads of one of the intermediate chips to respective one or more input signal pads of an adjacent intermediate chip.

15. The device of claim 12 further comprising:
    a controller for controlling access to the plurality of substantially identical chips;
    controller input connections to connect output signal pads from the bottom chip to an input side of the controller; and
    controller output connections to connect an output side of the controller to the input pads of the top chip.

16. The device of claim 15 wherein the controller is placed below the stacked chips, and the controller output connections comprise wire bonding.

17. The device of claim 15 wherein the controller is placed above the stacked chips, and the controller input connections comprise wire bonding.

18. A multi-chip device comprising:
- a plurality of substantially identical chips including a top chip and a bottom chip, the top and bottom chips having substantially identical signal pad arrangements, the bottom chip being flipped in orientation with respect to the top chip;
- at least one serial through-chip via to connect at least one output signal pad of the top chip to a respective input signal pad of the bottom chip; and
- at least one parallel through-chip via to connect at least one common connection signal pad on the top chip to at least one duplicate common connection signal pad on the bottom chip.

19. A multi-chip device comprising:
- a plurality of substantially identical chips including a top chip, an even number of intermediate chips and a bottom chip, each chip in the device having substantially identical signal pad arrangements, the plurality of chips being provided in a stack, each alternating chip in the stack being flipped in orientation with respect an adjacent chip;
- at least one parallel through-chip via;
- at least one serial through-chip via; and
- at least one serial connection between output and input signal pads of two of the intermediate chips.

20. A multi-chip package comprising:
- a plurality of substantially identical chips including a top chip, an even number of intermediate chips and a bottom chip, each chip in the device having substantially identical signal pad arrangements, the plurality of chips being provided in a stack, each alternating chip in the stack being flipped in orientation with respect an adjacent chip;
- at least one parallel through-chip via;
- at least one serial through-chip via;
- at least one serial connection between output and input signal pads of two of the intermediate chips;
- package input connectors for connection to external input signals; and
- package output connectors for connection to external output signals.

* * * * *